United States Patent
Kaminski (10) Patent No.: US 6,601,713 B2
(45) Date of Patent: Aug. 5, 2003

(54) RACK ASSEMBLY THAT DOES NOT REQUIRE TOOLS FOR COUPLING SLIDES TOGETHER

(75) Inventor: Joseph W. Kaminski, Campbell, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/014,997

(22) Filed: Dec. 10, 2001

(65) Prior Publication Data

US 2003/0106864 A1 Jun. 12, 2003

(51) Int. Cl.[7] .................................................. A47F 5/00
(52) U.S. Cl. ...................... 211/26; 211/175; 312/223.2; 312/334.46; 361/683
(58) Field of Search ................. 211/26, 175; 312/223.2, 312/334.1, 334.46, 334.47; 361/683

(56) References Cited

U.S. PATENT DOCUMENTS

| | | | | |
|---|---|---|---|---|
| 2,277,702 A | * | 3/1942 | Kennedy | |
| 3,133,768 A | * | 5/1964 | Klakovich | |
| 4,061,375 A | * | 12/1977 | Mertes | |
| 4,872,734 A | * | 10/1989 | Rechberg | |
| 5,316,389 A | * | 5/1994 | Hoffman | |
| 5,571,256 A | * | 11/1996 | Good et al. | 211/26 |
| 5,851,059 A | * | 12/1998 | Cirocco | |
| 6,230,903 B1 | * | 5/2001 | Abbott | 211/26 |
| 6,238,031 B1 | * | 5/2001 | Weng | 312/334.46 |
| 6,398,041 B1 | * | 6/2002 | Abbott | 211/26 |

* cited by examiner

Primary Examiner—Robert W. Gibson, Jr.

(57) ABSTRACT

A method and apparatus for easily and inexpensively coupling slides together. A spring that couples to one slide engages an opening in an adjoining slide to latch the two slides together in a fully extended position. The spring includes a protrusion that is angled on one side and that is abruptly raised on the other side. The two slides are easily coupled by engaging angled edges of the two slides and moving the slides together. As the protrusion reaches the opening, the force of the spring causes the protrusion to enter the opening such that the slides are in the latched position. Continued movement causes the angled side of the protrusion to contact the side of the opening and moves the protrusion out of the opening, allowing the second slide to be moved into the unextended position. Thereby slides are easily coupled together without the use of any tools. In addition, the slides are easily uncoupled by deforming the spring and moving the slides lengthwise. Thereby the slides are easily detached without the use of any tools.

16 Claims, 8 Drawing Sheets

RACK ASSEMBLY THAT DOES NOT REQUIRE TOOLS FOR COUPLING SLIDES TOGETHER

TECHNICAL FIELD

The present invention relates to the field of rack mounts. More specifically, the present invention relates to methods and apparatus for coupling slides together.

BACKGROUND ART

Racks are often used for storing computer components. A rack is a frame or cabinet into which the computer components are mounted. Many types of electronics and computing devices come in rack mounted packages, including servers, test instruments, telecommunications components and tape drives.

In a typical rack assembly, each computer component is attached to a chassis. The chassis is then be bolted into the rack or placed on a shelf located within the rack. In many instances sliding assemblies are used that allow the chassis to be extended from the rack. This allows for easy access to computer components.

Conventional sliding assemblies typically include two or more slides that are permanently attached such that the slides can move relative to each other within a specific range of motion. Typically, the slides are attached using rivets during the slide assembly fabrication process. However, the cost of riveting the slides together increases the cost of the assembly.

Another problem with slide assemblies that are permanently attached is that the slides are difficult to separate if separation is required. For example, rivets are hard to remove. In addition, repair is difficult if not impossible due to the permanent attachment of the slides.

Also, it is desirable to minimize or eliminate the use of tools in the assembly process. This saves both assembly time and cost of assembly.

Accordingly, a method and apparatus is needed that allows for easily and inexpensively coupling slides together. Moreover, a method and apparatus is needed that does not require the use of tools to couple the slides together. Furthermore, a method and apparatus is needed that meets the above needs and that allows for uncoupling slides without the use of tools.

DISCLOSURE OF THE INVENTION

The method and apparatus of the present invention allows for easily and inexpensively coupling slides together. Moreover, the method and apparatus of the present invention does not require the use of tools to couple the slides together. In addition, tools are not required for uncoupling the slides.

A rack assembly is disclosed that includes a rack. Computer related components are disposed within one or more chassis that is disposed within the rack. A plurality of longitudinal members referred to hereinafter as slides allow the chassis to be extended from the rack such that the computer related component can be easily replaced or serviced.

A first longitudinal member referred to hereinafter as first slide (e.g., an outer slide) couples to the rack. A protrusion extends from a side surface of the spring that is angled on one side and that is abruptly raised on the other side.

A second longitudinal member referred to hereinafter as a second slide (e.g., an intermediate slide) has a first opening extending therethrough. The second slide is easily coupled to the first slide by engaging angled edges that hold the two slides together. The second slide is then slid towards the first slide. This movement causes the protrusion to enter the first opening. Continued movement causes the angled side of the protrusion to contact the side of the first opening and allows the protrusion to move out of the first opening, allowing the second slide to be moved into the unextended position. A stop prevents inward movement beyond the unextended position. Thereby slides are easily coupled together without the use of any tools.

The mechanism is easily unlatched for moving the assembly into the unextended position. More particularly, when the second slide is moved inward from the extended position (towards the unextended position) the protrusion disengages from the opening in the second slide so as to unlatch the first slide from the second slide.

As the second slide is extended, the protrusion engages the opening in the second slide so as to latch the second slide to the first slide at the extended position. More particularly, the abruptly raised side of the protrusion contacts the side of the opening in the second slide and prevents further movement of the second slide relative to the first slide. This prevents disengagement of the first slide and the second slide, preventing the two slides from being detached.

The second slide can be easily uncoupled from the first slide by deforming the spring and extending the second slide outward. More particularly, the spring is deformed such that the protrusion no longer engages the second slide. The second slide is then moved to uncouple the second slide from the first slide. Thereby the second slide is easily uncoupled from the first slide without the use of any tools.

Other features and advantages of the invention will become apparent from the following detailed description, taken in conjunction with the accompanying drawings, illustrating by way of example the principles of the invention.

BRIEF DESCRIPTION OF THE DRAWINGS

The accompanying drawings, which are incorporated in and form a part of this specification, illustrate embodiments of the invention and, together with the description, serve to explain the principles of the invention.

The drawings referred to in this description should not be understood as being drawn to scale except if specifically noted.

BEST MODES FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1A:
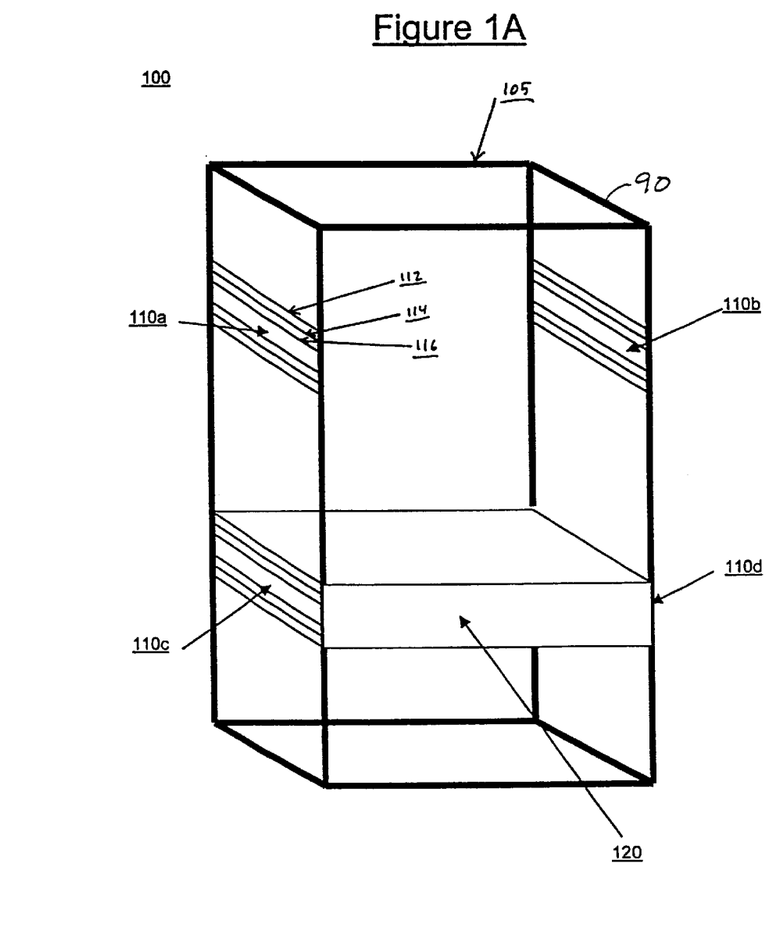
FIG. 1A is a perspective view of a rack assembly that includes two pairs of slide assemblies in an unextended position in accordance with an embodiment of the present invention.

FIG. 1A shows rack assembly 100 that includes slide assemblies 110a–110d that are in an unextended position. Rack assembly 100 also includes chassis 120 and rack 90. Slide assemblies 110c and 110d are coupled to rack 90 and are coupled to chassis 120. Chassis 120 is shown in FIG. 1A to be in an unextended position due to the positioning of slide assemblies 110c and 110d. Chassis 120 is for receiving computer-related components such as, for example, a test instrument, telecommunications equipment, a data storage device, a server, a printer, a display, etc.

Figure 1B:
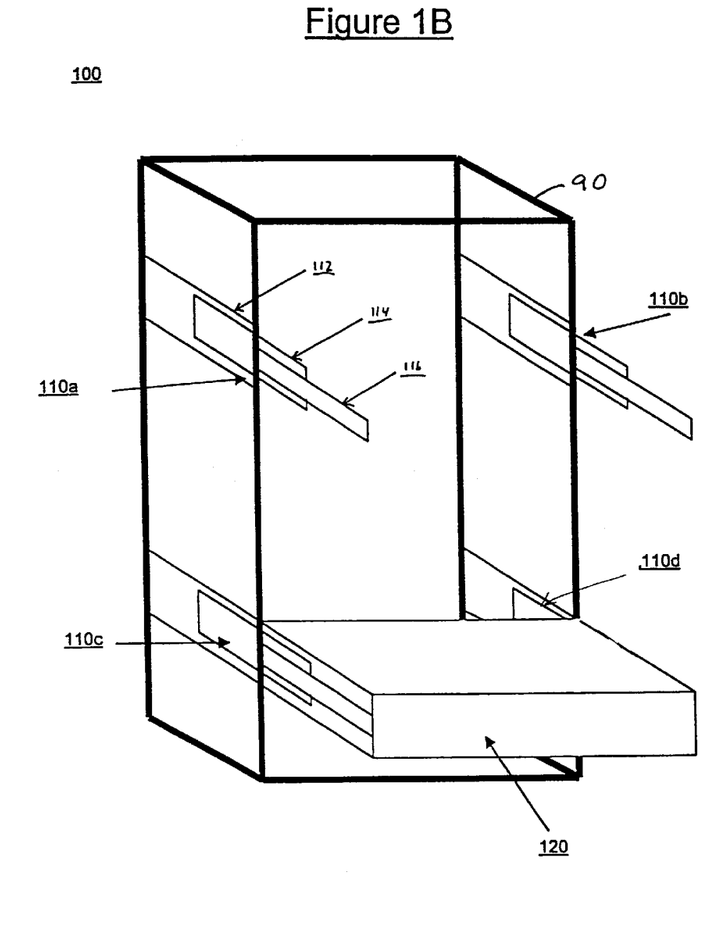
FIG. 1B is a perspective view of a rack assembly that includes two pairs of slide assemblies in a fully extended position in accordance with an embodiment of the present invention.

Slide assemblies 110a–110d are operable such that they can be extended out from the unextended position illustrated in FIG. 1A to a fully extended position illustrated in FIG. 1B. More particularly, the extension of slide assemblies 110c and 110d is operable to move chassis 120 into the fully extended position illustrated in FIG. 1B. In the fully extended position the computer-related components within chassis 120 can be readily accessed for service and/or replacement.

Continuing with FIGS. 1A–1B, slide assemblies 110a–110d include outer slide 112, intermediate slide 114, and inner slide 116. In one embodiment, outer slide 112 is slidably engaged with intermediate slide 114 such that intermediate slide 114 can slide lengthwise with respect to outer slide 112. Similarly, inner slide 116 slidably engages with intermediate slide 114 such that inner slide 116 can slide lengthwise with respect to intermediate slide 114.

Figure 2:
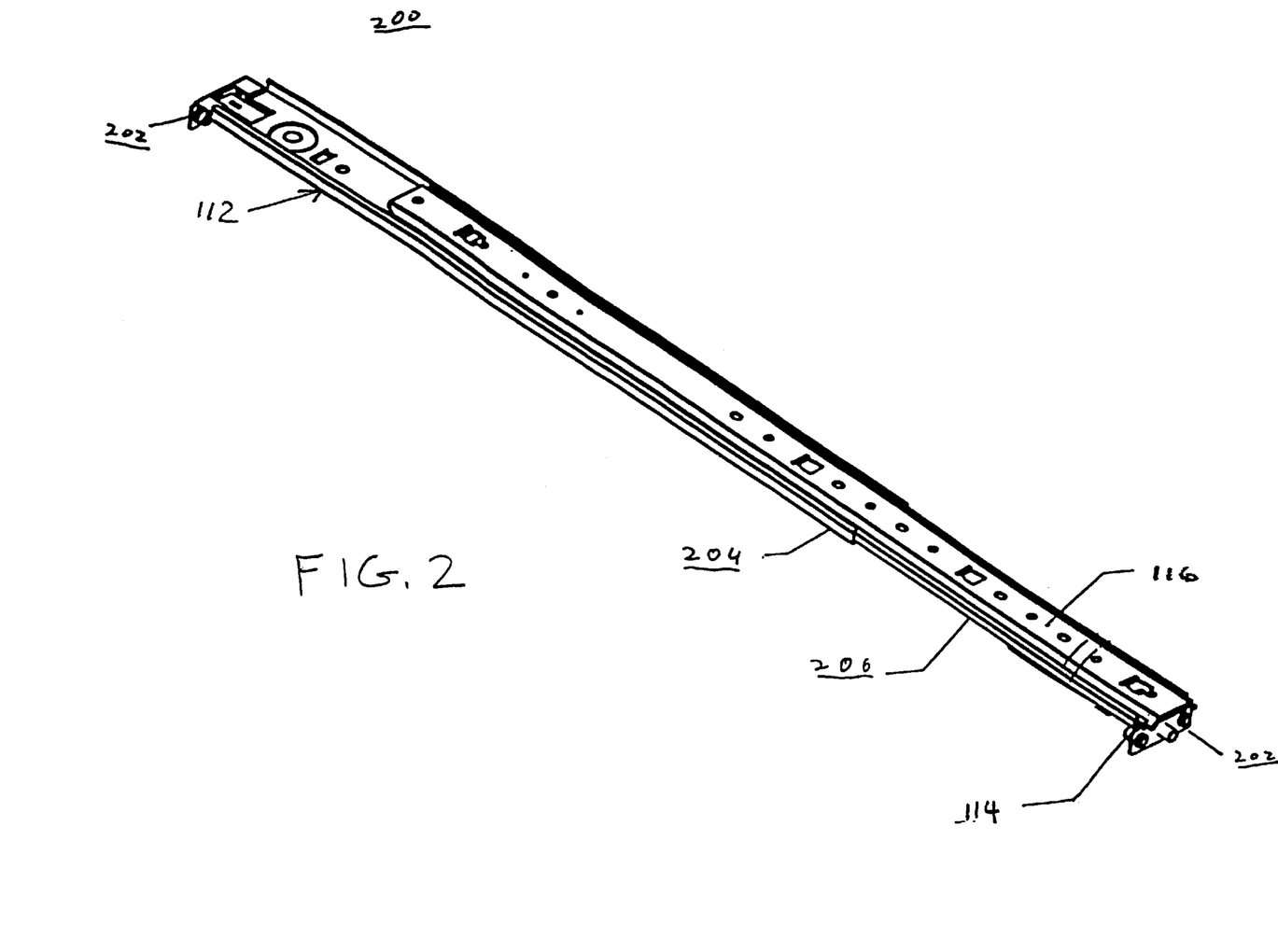
FIG. 2 shows a perspective view of a slide assembly in accordance with an embodiment of the present invention.

FIG. 2 shows slide assembly 200 to include mounting flange 202, outer slide 112, intermediate slide 114 and inner slide 116. In the present embodiment mounting flange 202 is used for mounting slide assembly 200 to a rack (e.g., rack 90 of FIGS. 1A–1B).

Continuing with FIG. 2, outer slide 112 includes first outer slide component 204 and second outer slide component 206. First outer slide component 204 and second outer slide component 206 allow for adjusting the length of slide assembly 200. More particularly, rack assemblies vary in depth. First outer slide component 204 and second outer slide component 206 operating in conjunction provide for adjustment relating to depth. Therefore, slide assembly 200 can be used in any rack, regardless of the depth.

In the present embodiment, outer slide 112 is coupled to rack 90 of FIGS. 1A–1B and is slidably engaged with intermediate slide 114 such that intermediate slide 114 can slide lengthwise with respect to outer slide 112. Similarly, inner slide 116 slidably engages with intermediate slide 114 such that inner slide 116 can slide lengthwise with respect to intermediate slide 114.

Figure 3A:
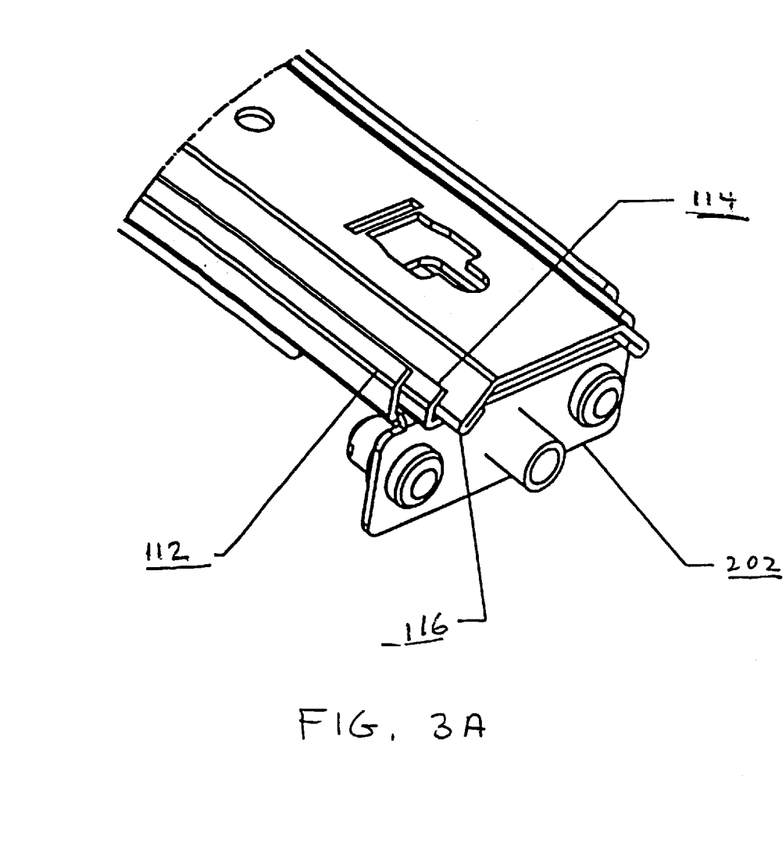
FIG. 3A illustrates an expanded view of a portion of the slide assembly of FIG. 2 in which the intermediate slide and the inner slide are slid outward with respect to the outer slide position in accordance with an embodiment of the present invention.
Figure 3B:
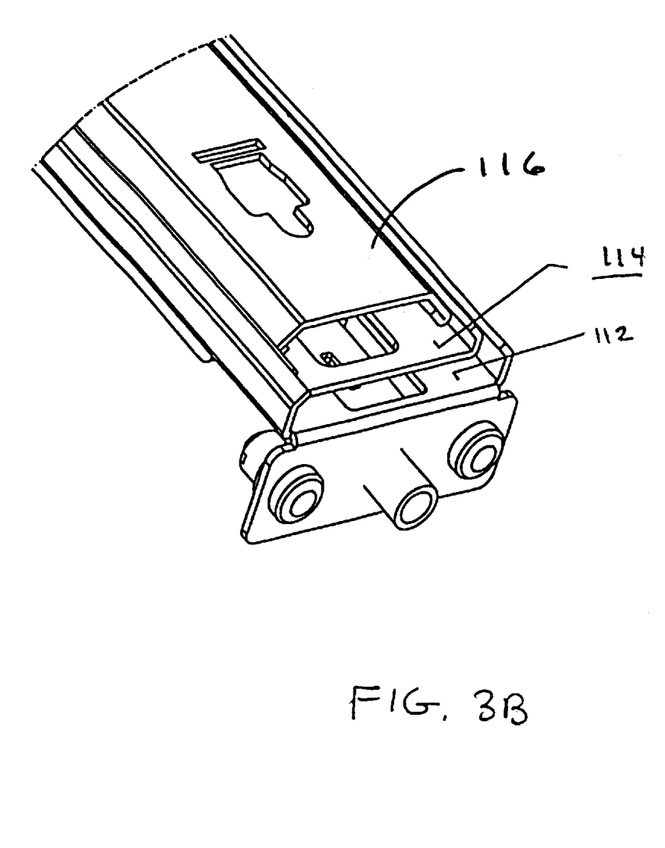
FIG. 3B illustrates an expanded view of a portion of the slide assembly of FIG. 2 in which the intermediate slide and the inner slide are slid inward with respect to the outer slide position in accordance with an embodiment of the present invention.

Referring to FIGS. 3A–3B, outer slide 112 includes edges that are angled and intermediate slide 114 includes corresponding edges that are angled. The shape of the edges of outer slide 112 and intermediate slide 114 allow intermediate slide 114 to be engaged with outer slide 112 such that intermediate slide 114 can slide lengthwise with respect to outer slide 112 and such that the two slides are held together laterally. In the present embodiment, once outer slide 112 is engaged with intermediate slide 114 the two slides can only move within a limited range with respect to each other.

Still referring to FIGS. 3A–3B inner slide 116 also includes edges that are angled and that correspond to edges of intermediate slide 114. The shape of the edges of inner slide 112 and intermediate slide 114 allow intermediate slide 114 to be engaged with inner slide 116 such that intermediate slide 114 and inner slide 116 are held together laterally. In the present embodiment, once inner slide 116 is engaged with intermediate slide 114 the two slides can only move lengthwise within a limited range with respect to each other.

Figure 4:
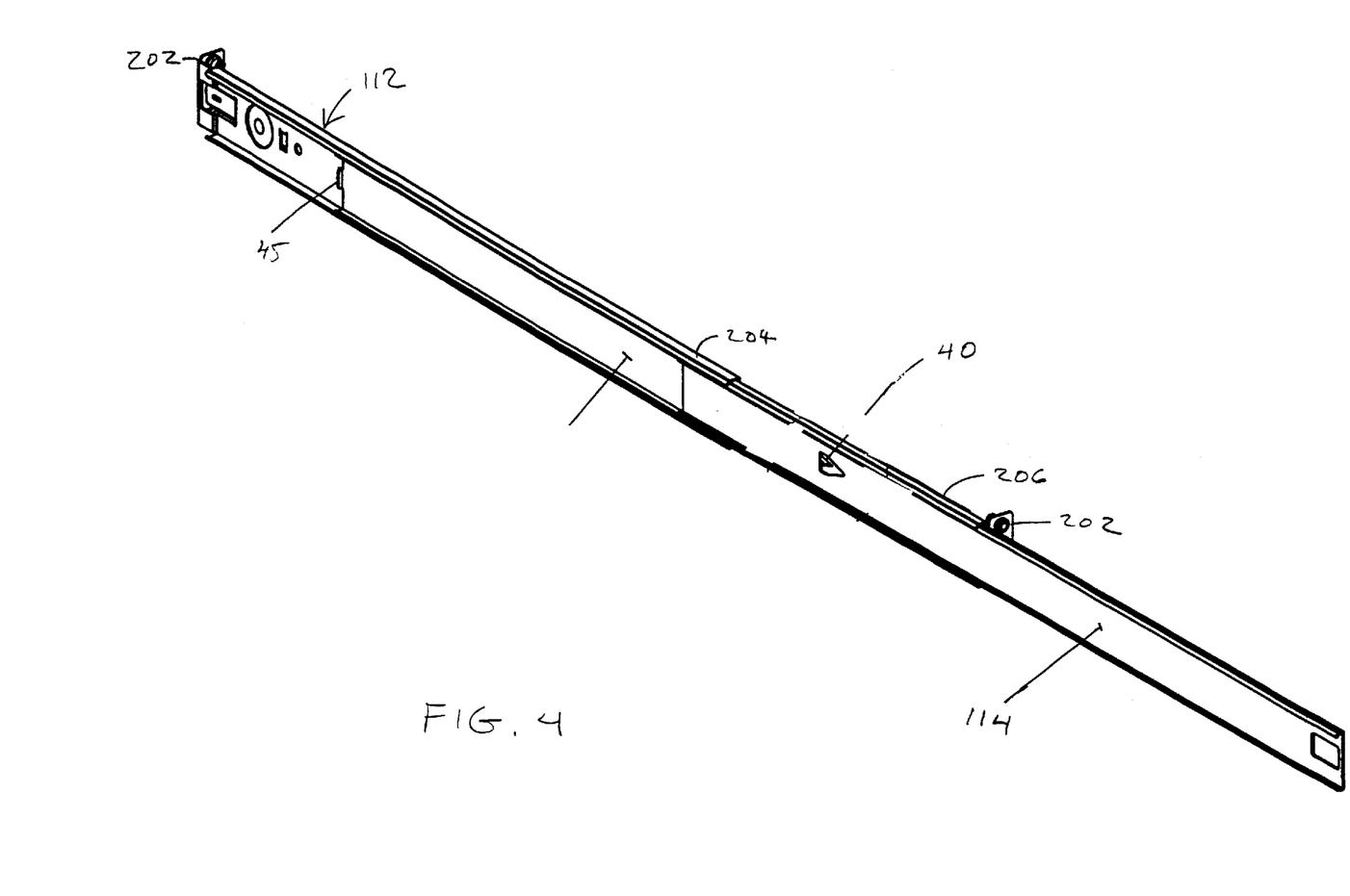
FIG. 4 shows an outer slide that is coupled to an intermediate slide and that is in the latched position in accordance with an embodiment of the present invention.

Referring now to FIG. 4, intermediate slide 114 and outer slide 112 are shown to be in the latched position. In the latched position protrusion 40 engages the side of opening 42 so as to prevent further outward movement of intermediate slide 114 relative to outer slide 112. A stop tab 45 limits inward movement of intermediate slide 114 relative to outer slide 112. Thus, once outer slide 112 is engaged with intermediate slide 114, the two slides can only move within the range defined by stop tab 45 and the latched position shown in FIG. 4.

Figure 5A:
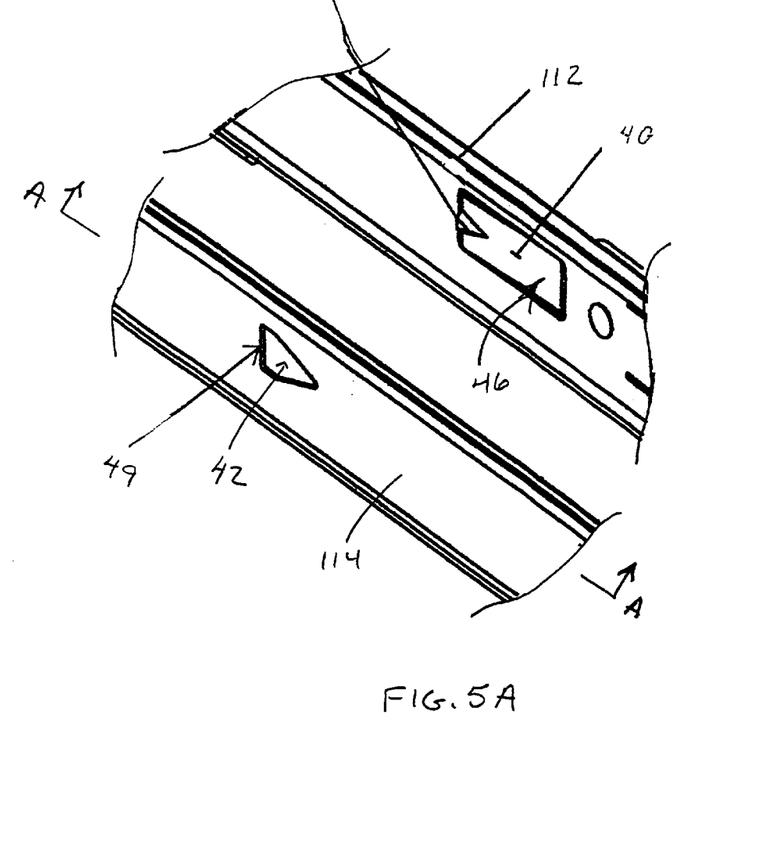
FIG. 5A shows an expanded view of a portion of the outer slide and a portion of the intermediate slide of FIG. 4 when the outer slide is detached from the intermediate slide in accordance with an embodiment of the present invention.
Figure 5B:
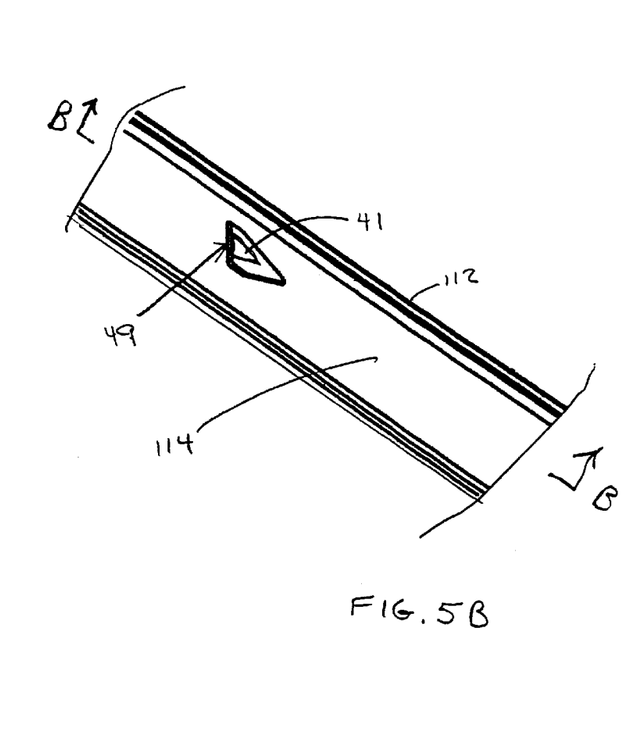
FIG. 5B shows an expanded view of a portion of the outer slide and a portion of the intermediate slide of FIG. 4 when the outer side and the intermediate slide are engaged together in the latched position in accordance with an embodiment of the present invention.
Figure 6A:
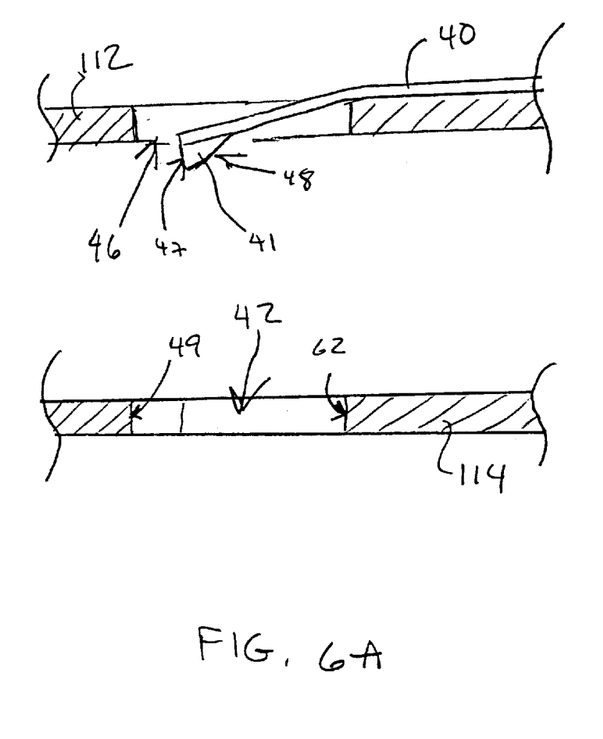
FIG. 6A shows an expanded cross sectional view of the structure of FIG. 5A across section A—A in accordance with an embodiment of the present invention.

Referring now to FIGS. 5A- and 6A, outer slide 112 has opening 46 extending therethrough. Spring 40 is coupled to outer slide 112 and extends through opening 46 so as to extend towards intermediate slide 114. In the present embodiment spring 40 is metal. However, other materials could also be used to form spring 40.

Intermediate slide 114 includes opening 42 that extends through intermediate slide 114. In the present embodiment, opening 42 has a pentagonal shape. In an alternate embodiment that is not shown opening 42 has a triangular shape. However, alternatively other shapes could be used.

Protrusion 41 extends from spring 40 in the direction of intermediate slide 114. Thus, when intermediate slide 114 is coupled to outer slide 112 protrusion 41 is forced against the side of intermediate slide 114 by the force of spring 40.

In the present embodiment, surface 49 is disposed such that it engages protrusion 41. In one embodiment, surface 49 extends perpendicular to the direction of movement of intermediate slide 114. Thus, surface 49 is disposed at a 90-degree angle with respect to the side surfaces of intermediate slide 114.

Referring now to FIG. 6a, protrusion 41 is angled on one side as shown by angled surface 48. The other side of protrusion 41 forms stop surface 47 that is abruptly raised from spring 40. More particularly, stop surface 47 rises abruptly on one side of protrusion 41.

Because stop surface 47 is abruptly raised, protrusion 41 engages side surface 49 of opening 42 when intermediate slide 114 is moved outward such that it reaches the latched position. Thus, slide 114 is prevented from further outward movement. This prevents intermediate slide 114 from being detached from outer slide 112.

Figure 6B:
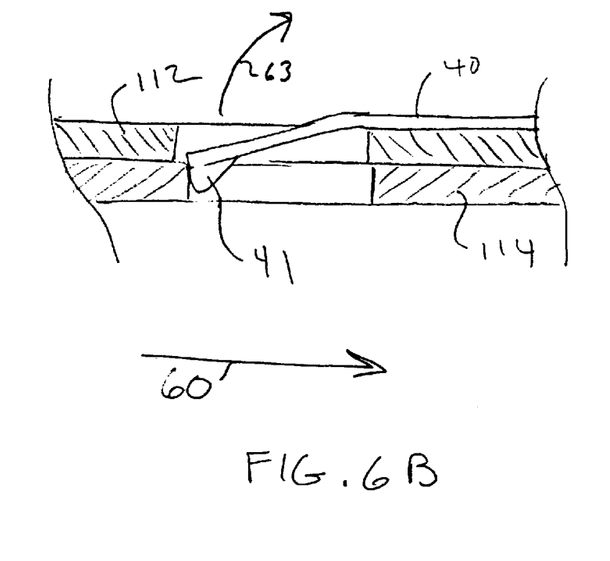
FIG. 6B shows an expanded cross sectional view of the structure of FIG. 5B across section B—B in accordance with an embodiment of the present invention.

However, protrusion 41 does not prevent intermediate slide 114 from moving inward. More particularly, angled surface 48 allows for intermediate slide 114 to be slid inward as shown by arrow 60 of FIG. 6B. Upon inward movement of intermediate slide 114 protrusion 41 disengages from opening 42 so as to unlatch outer slide 112 from intermediate slide 114. More particularly, movement in the direction shown by arrow 60 of FIG. 6B causes angled surface 48 of protrusion 41 to engage surface 62 of opening 42. Because surface 48 is angled, spring 40 is deflected as protrusion 41 continues to move inward, causing protrusion 41 to move out of opening 42. After protrusion 41 moves out of opening 42 continued movement is unimpeded until the stop 45 is reached and the fully unextended position is realized.

In the present embodiment protrusion 41 is shown to have a triangular shape. However, alternatively other shapes could also be used such as, for example a rounded shape, an oval shape, etc. In the present embodiment protrusion 41 is formed using a stamping process. However, alternatively other methods could be used such as, for example, casting to form protrusion 41.

Outer slide 112 is easily coupled to intermediate slide 114 by engaging outer slide 112 with intermediate slide 114 and sliding intermediate slide 114 inward with respect to outer slide 112 such that protrusion 41 moves past opening 42. In the present embodiment this inward movement is in the direction of movement indicated by arrow 60 of FIG. 6B. As protrusion 41 reaches opening 42 spring 40 will deflect such that protrusion 41 extends into opening 42. When protrusion 41 first extends into opening 42 protrusion 41 will reach the latched position shown in FIG. 6B. Once the latched position is reached the two slides are securely coupled such that the two slides can move from the extended position into the unextended position as discussed above.

Outer slide 112 can easily be detached from intermediate slide 114. When outer slide 112 and intermediate slide 114 are in the latched position spring 40 is moved in the direction indicated by arrow 63 shown in FIG. 6B. This deforms spring 40 such that protrusion 41 no longer extends into opening 42. Intermediate slide 114 is then moved outward (opposite the direction indicated by arrow 60) causing protrusion 41 to move past opening 42, allowing further unrestricted movement of intermediate slide 114 until intermediate slide 114 is disengaged from outer slide 112. Thereby outer slide 112 is quickly and easily detached from intermediate slide 114.

No tools are required for uncoupling intermediate slide 114 from outer slide 112. Moreover, the process of uncoupling the two slides is quick and easy. This results in savings in time and savings in cost as compared to prior art processes. Also the components are inexpensively fabricated.

The embodiments illustrated in FIGS. 1A–6B show a spring that attaches to the rear side of outer slide 112 and that extend through an opening 46 within outer slide 112. Alternatively, the spring attaches to the outer slider such that the spring is disposed between the two adjoining slides. That is, the spring is attached to the front side of the outer slide (the side that is directly opposite the adjoining intermediate slide) and no opening 46 is required. In yet another embodiment the spring could be mounted on intermediate slide 114 for engaging a corresponding opening on outer slide 112.

In the present embodiment intermediate slide 114 couples to inner slide 116 using the same structure and methods disclosed in FIGS. 1A–6B above. The spring can be mounted on either inner slide 116 or on intermediate slide 114. The spring can be mounted between the inner slide 116 and the intermediate slide 114. Alternatively, the spring can be mounted on the opposite side of either the inner slide 116 or the intermediate slide 114 and can extend through an opening to engage a corresponding opening on the adjoining slide.

Figure 7:
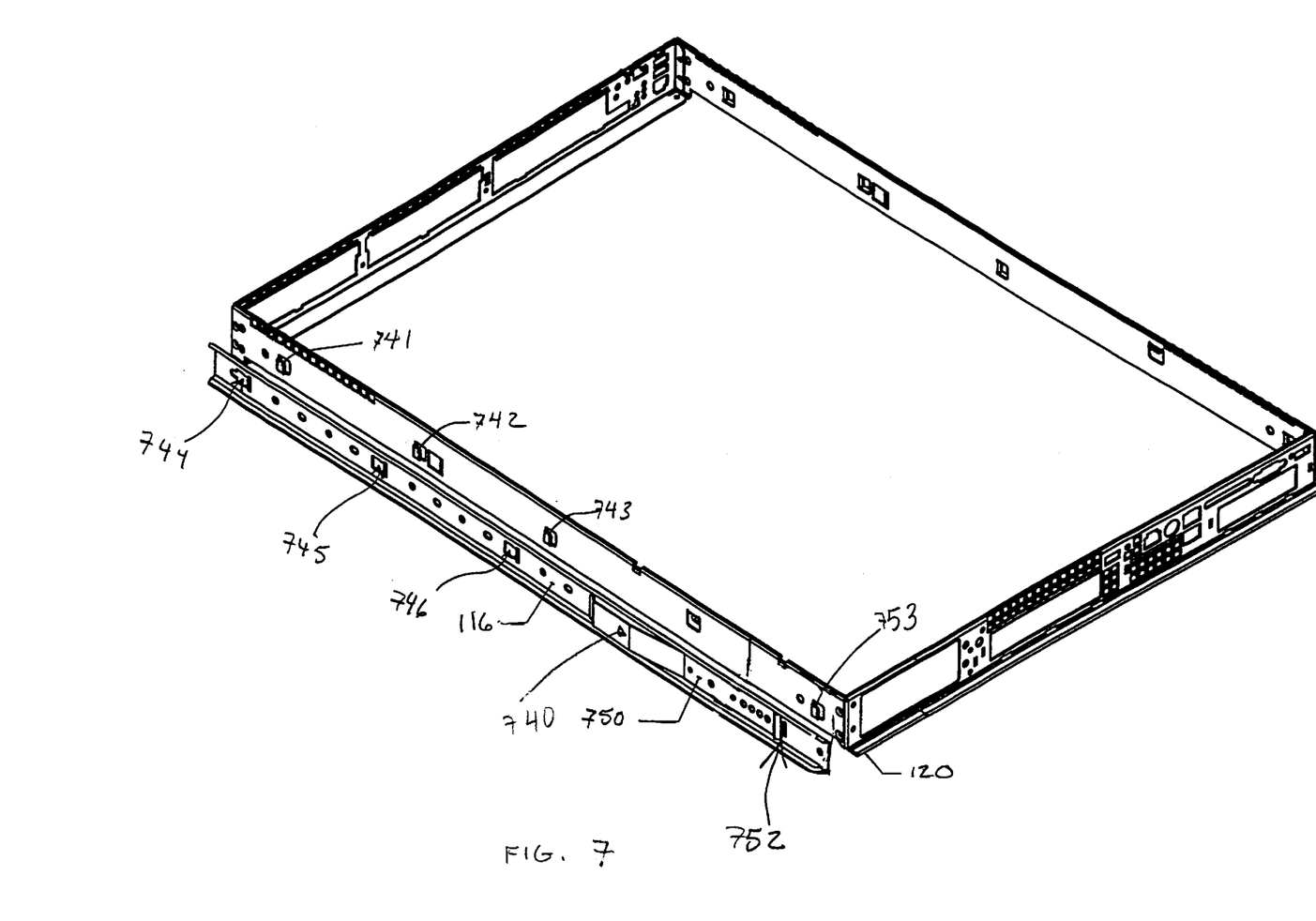
FIG. 7 shows a perspective view of an inner slide that is disposed near a side surface of a chassis in accordance with an embodiment of the present invention.
Figure 8:
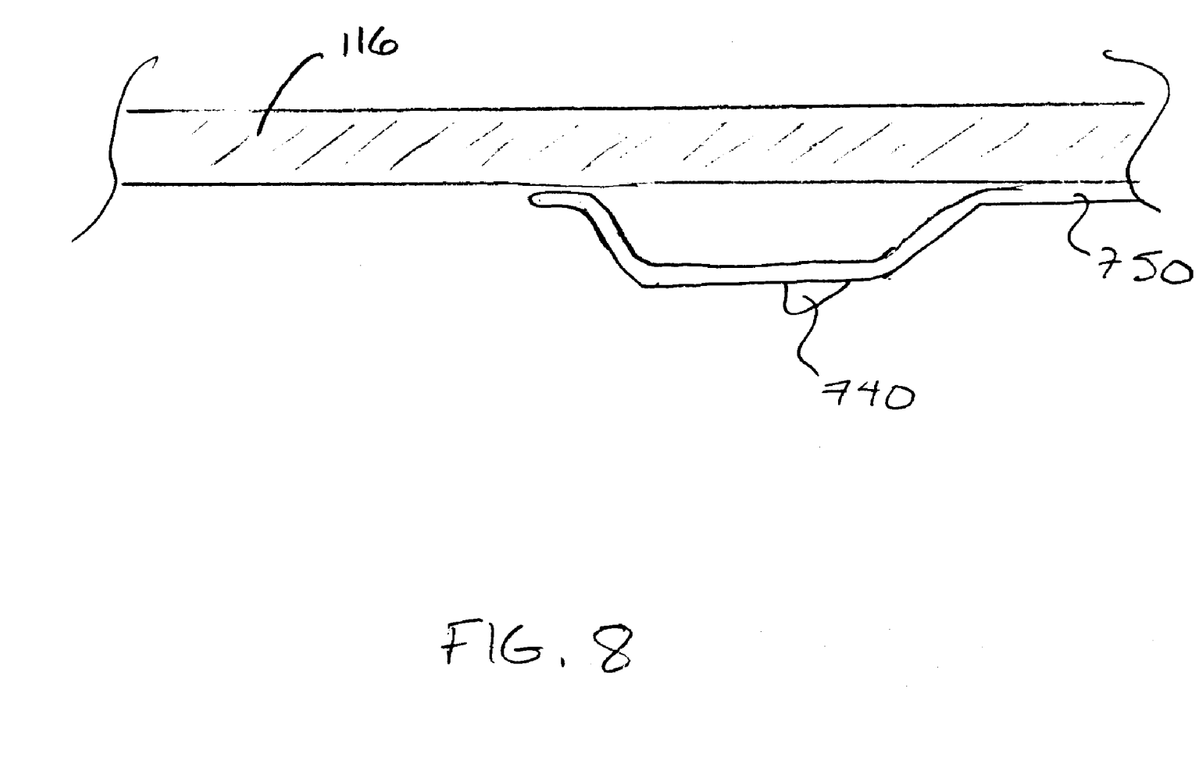
FIG. 8 shows an expanded cross-sectional view of a portion of the structure shown in FIG. 7 in accordance with an embodiment of the present invention.

FIGS. 7–8 show an embodiment in which spring 740 is attached to inner slide 116 on the side of inner slide 116 that directly opposes or "faces" intermediate slide 114. In the embodiment shown in FIGS. 7–8, inner slide 116 couples to chassis 120 using L-shaped protrusions 741–743 and 753 that engage openings 744–746 and 752.

Continuing with FIGS. 7–8, protrusion 740 extends from spring 750 such that, when intermediate slide 114 is engaged with inner slide 116, protrusion 740 engages a corresponding opening in intermediate slide 114 so as to latch intermediate slide 114 and inner slide 116 in the fully extended position. Thus intermediate slide 114 is easily and inexpensively coupled to inner slider 116 by engaging the inner slide with the intermediate slide 114 and sliding the inner slide 114 inward with respect to intermediate slide 112 such that the protrusion moves past the opening in intermediate slide 114 (e.g., an opening identical to opening 42 of FIGS. 4–6B). Once the latched position is reached the two slides are securely coupled such that the two slides can move from the extended position into the unextended position as discussed above. Also inner slide 116 can easily be detached from intermediate slide 114 without the use of tools.

This allows for easily and inexpensively attaching and detaching any or all of slides 112, 114 and 116 from each other without any use of tools. Thus, the method and apparatus of the present invention allows for easily and inexpensively coupling two slides. Also, the method and apparatus of the present invention does not require the use of tools to couple the slides. In addition, tools are not required for uncoupling the slides.

While the present invention has been described in particular embodiments, it should be appreciated that the present invention should not be construed as limited by such embodiments, but rather construed according to the below claims.

What is claimed is:

1. An assembly comprising:

a first longitudinal member;

a spring coupled to said first longitudinal member;

said spring including a triangular protrusion that that extends from said spring; and a second longitudinal member including a first opening, said second member slidably engageable with said first longitudinal member such that said second longitudinal member can move from an unextended to an extended position, said protrusion engaging said first opening so as to latch said first longitudinal member to said second longitudinal member at said extended position, said triangular protrusion angled on one side such that when said second longitudinal member is moved inward said triangular protrusion moves out of a second opening so as to unlatch said first longitudinal member from said second longitudinal member, wherein said triangular protrusion rises abruptly on one side for engaging said perpendicular surface of said second longitudinal member so as to latch said first longitudinal member to aid second longitudinal member, preventing said second longitudinal member from being disengaged from said first longitudinal member.

2. The assembly of claim 1 wherein said second opening has a triangular shape.

3. The assembly of claim 1 wherein said first longitudinal member has a second opening extending therethrough, said spring coupled to said first longitudinal member such that said spring partially extends through said second opening.

4. The assembly of claim 1 wherein said spring is metal and wherein said protrusion is formed using a stamping process.

5. The assembly of claim 1 wherein said first opening includes a perpendicular surface, said perpendicular surface extending perpendicular to the direction of movement of said second longitudinal member when said second longitudinal member is moving from said unextended position to said extended position.

6. The assembly of claim 1 wherein said first longitudinal member is coupled to a rack.

7. The assembly of claim 6 wherein said second longitudinal member is coupled to a chassis that holds a computer-related component.

8. A rack assembly comprising:
   a rack;
   a first longitudinal member;
   a spring coupled to said first longitudinal member wherein said longitudinal member is coupled to said rack;
   said spring including a triangular protrusion that that extends from said spring; and
   a second longitudinal member including a first opening, said second member slidably engageable with said first longitudinal member such that said second longitudinal member can move from an unextended to an extended position, said triangular protrusion engaging said first opening so as to latch said first longitudinal member to said second longitudinal member at said extended position, said protrusion angled on one side such that when said second longitudinal member is moved inward said triangular protrusion moves out of a second opening so as to unlatch said first longitudinal member from said second longitudinal member, wherein said triangular protrusion rises abruptly on one side for engaging said perpendicular surface of said second longitudinal member so as to latch said first longitudinal member to said second longitudinal member, preventing said second longitudinal member from being disengaged from said first longitudinal member.

9. The rack assembly of claim 8 further comprising a chassis for receiving a computer-related component, said chassis coupled to said second longitudinal member such that said chassis can be moved from an unextended position into an extended position.

10. The rack assembly of claim 1 wherein said second opening has a triangular shape.

11. The rack assembly of claim 1 wherein said first longitudinal member has a second opening extending therethrough, said spring coupled to said first longitudinal member such that said spring partially extends through said second opening.

12. The rack assembly of claim 8 wherein said spring is metal and wherein said protrusion is formed using a stamping process.

13. The rack assembly of claim 8 wherein said second opening includes a perpendicular surface, said perpendicular surface extending perpendicular to the direction of movement of said second longitudinal member when said second longitudinal member is moving from said unextended position to said extended position.

14. A method for coupling a first longitudinal member to a second longitudinal member comprising:
   providing a first longitudinal member having a spring coupled thereto, said spring including a triangular protrusion that extends from said spring that is abruptly raised on one side and that is angled on another side;
   providing a second longitudinal member including a first opening;
   engaging said first longitudinal member with said second longitudinal member; and
   sliding said second longitudinal member inward with respect to said first longitudinal member such that said triangular protrusion engages said first opening so as to latch said first longitudinal and said second longitudinal member in an extended position, said abruptly raised surface of said spring engaging a side of said opening so as to prevent said first longitudinal member from being detached from said second longitudinal member, wherein said triangular protrusion rises abruptly on one side for engaging said perpendicular surface of said second longitudinal member so as to latch said first longitudinal member to said second longitudinal member, preventing said second longitudinal member from being disengaged from said first longitudinal member.

15. The method of claim 14 further comprising:
   deforming said spring such that said protrusion no longer engages said first opening; and
   moving said second latitudinal member while said spring is deformed to uncouple said first longitudinal member from said second longitudinal member.

16. The method of claim 15 wherein no tools are required for coupling said first longitudinal member to said second longitudinal member and wherein no tools are required for uncoupling said first longitudinal member from said second longitudinal member.

* * * * *